United States Patent
Kim et al.

(10) Patent No.: US 7,659,573 B2
(45) Date of Patent: Feb. 9, 2010

(54) SEMICONDUCTOR DEVICE AND METHOD OF MANUFACTURING THE SAME

(75) Inventors: Young-ho Kim, Hwaseong-si (KR); Yong-kyu Lee, Gwacheon-si (KR); Myung-jo Chun, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 183 days.

(21) Appl. No.: 11/833,019

(22) Filed: Aug. 2, 2007

(65) Prior Publication Data

US 2008/0035962 A1    Feb. 14, 2008

(30) Foreign Application Priority Data

Aug. 9, 2006    (KR) ............ 10-2006-0075288

(51) Int. Cl.
*H01L 29/76* (2006.01)
(52) U.S. Cl. .................. 257/330; 257/E29.262
(58) Field of Classification Search ......... 257/288, 257/330, 333, E29.262
See application file for complete search history.

(56) References Cited

U.S. PATENT DOCUMENTS

| | | | |
|---|---|---|---|
| 2005/0001266 A1* | 1/2005 | Kim | 257/330 |
| 2005/0253189 A1 | 11/2005 | Cho et al. | |
| 2006/0027861 A1* | 2/2006 | Takaishi | 257/330 |
| 2006/0267085 A1* | 11/2006 | Matsuura | 257/330 |
| 2006/0273388 A1* | 12/2006 | Yamazaki | 257/330 |
| 2007/0200169 A1* | 8/2007 | Kim | 257/330 |

FOREIGN PATENT DOCUMENTS

| | | |
|---|---|---|
| JP | 2000-077632 | 3/2000 |
| JP | 2001-035942 | 2/2001 |
| KR | 1999-145457 | 5/1999 |
| KR | 1020050004352 | 1/2005 |
| KR | 10-2005-0122475 | 12/2005 |
| KR | 10-2006-0058959 | 2/2008 |

OTHER PUBLICATIONS

English Abstract Publication No. 1020060058959.
Korean Notice of Allowance: 9-5-2007-064529537; Nov. 11, 2007.
English Abstract for Publication No. 102005004352.

* cited by examiner

*Primary Examiner*—Nathan W Ha
(74) *Attorney, Agent, or Firm*—F. Chau & Associates, LLC

(57) ABSTRACT

A semiconductor device includes a semiconductor substrate, source and drain regions formed on the semiconductor substrate, a recess channel that is formed on the inner surface of a recess region, which is formed on the semiconductor substrate between the source and drain regions, and in an epitaxial semiconductor film in which dopants are doped. The semiconductor device further includes a gate insulating film formed on the recess channel, and a gate electrode that fills the recess region and is formed on the gate insulating film.

5 Claims, 11 Drawing Sheets

SEMICONDUCTOR DEVICE AND METHOD OF MANUFACTURING THE SAME

CROSS REFERENCE TO RELATED APPLICATION

This application claims priority from Korean Patent Application No. 10-2006-0075288 filed on Aug. 9, 2006, the disclosure of which is hereby incorporated by reference herein in its entirety.

BACKGROUND OF THE INVENTION

1. Technical Field

The present disclosure relates to a semiconductor device and to a method of manufacturing the semiconductor device, and more particularly to a semiconductor device having a recess channel and a method of manufacturing the semiconductor device.

2. Description of the Related Art

As semiconductor devices have become more highly integrated, the size of metal oxide semiconductor (MOS) devices have consequently also been reduced. Further, the length of a channel has been reduced up to the degree of deep sub-micron so as to improve the operational speed and current driving performance of the device.

As the length of the channel has been reduced, depletion regions of a source electrode and a drain electrode may be penetrated into the channel, so that the effective length of the channel is reduced. Consequently, a threshold voltage may be reduced, which in turn may cause a short channel effect in which the MOS transistor is deprived of a gate control function. In addition, a punchthrough effect in which dopants in the source and drain electrodes are diffused to the side during the operation of the transistor may also occur.

In particular, as design rules are reduced, a short channel effect is caused. Further, as the amount of implanted ions is increased, leakage current is also increased. Accordingly, it may be difficult to ensure refresh time.

For this reason, there has been proposed a RCAT (Recess Channel Array Transistor). With the RCAT, a recess channel trench is formed in a region, in which the channel of a transistor is formed, so as to ensure a sufficient length of the channel.

FIG. 1 shows a semiconductor device including a common recess channel. In general, dopants for the formation of the channel exist in a channel region. However, in the case of the recess channel shown in FIG. 1, the concentration of the dopants for the formation of the channel is not uniform in the recess channel that is formed so as to correspond to the profile of a recess region r. In other words, a B region positioned at the lower portion of the gate in the recess channel region has a higher concentration of the dopants as compared to A and C regions positioned at the side portions of the gate. As the recess region r is formed and the dopants for the formation of the channel are then implanted, there may be a difficulty in which each of the side regions (A and C regions) has a lower concentration of the dopants as compared to the lower region (B region). Further, as the concentration of the dopants is not uniform in the channel region, there is a possibility that the characteristic and reliability of the device may deteriorate.

SUMMARY OF THE INVENTION

Embodiments of the present invention provide a semiconductor device that has a uniform concentration of dopants in a recess channel and which can more stably operate.

Embodiments of the present invention provide a method of manufacturing the above-mentioned semiconductor device.

In accordance with an embodiment of the present invention, a semiconductor device is provided. The semiconductor device includes a semiconductor substrate, source and drain regions formed on the semiconductor substrate, a recess channel formed on the inner surface of a recess region, which is formed on the semiconductor substrate between the source and drain regions, and in an epitaxial semiconductor film in which dopants are doped. The semiconductor device further includes a gate insulating film formed on the recess channel, and a gate electrode that fills the recess region and is formed on the gate insulating film.

In accordance with another embodiment of the present invention, a method of manufacturing of a semiconductor device is provided. The method includes providing a semiconductor substrate and forming a recess region on the semiconductor substrate, forming an epitaxial semiconductor film, in which dopants are doped, on the inner surface of the recess region so as to form a recess channel. The method further includes forming a gate insulating film on the epitaxial semiconductor film, and forming source and drain regions on the semiconductor substrate on both sides of a gate electrode filling the recess region and the upper portion of the recess region.

BRIEF DESCRIPTION OF THE DRAWINGS

Exemplary embodiments of the present invention can be understood in more detail from the following description taken in conjunction with the attached drawings in which.

DESCRIPTION OF THE PREFERRED EMBODIMENTS OF THE INVENTION

Figure 1:
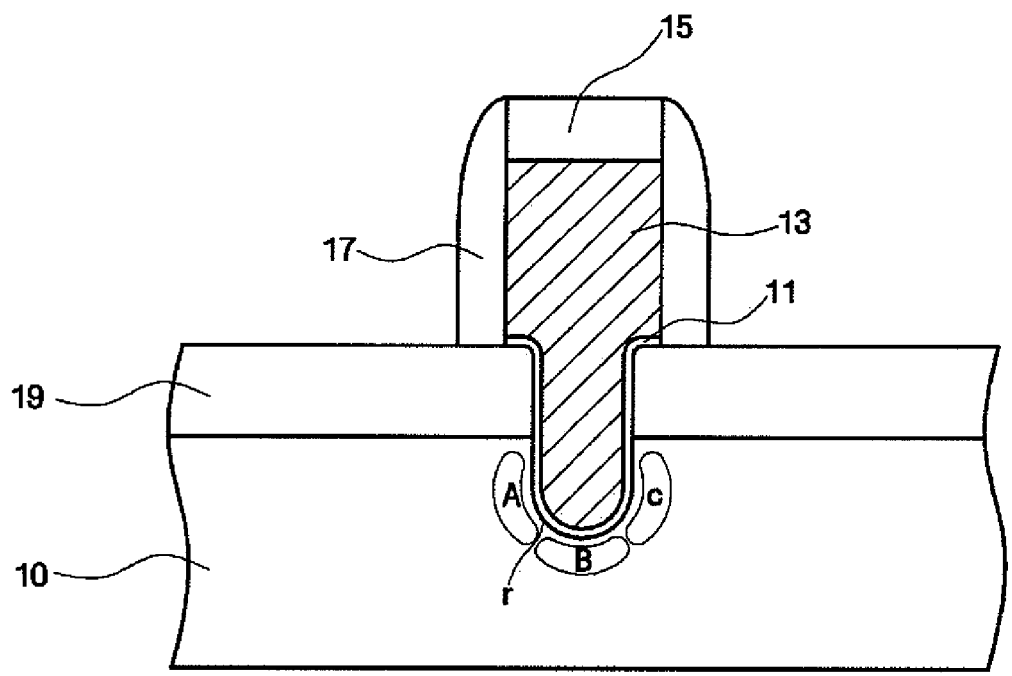
FIG. 1 is a cross-sectional view of a semiconductor device in the related art.

The present invention may, however, be embodied in many different forms and should not be construed as being limited to the embodiments set forth herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, preferred embodiments of the invention will be described below with reference to cross-sectional views and/or plan views, which are exemplary drawings of the invention. The exemplary drawings may be modified depending on manufacturing techniques and/or tolerances. Accordingly, the preferred embodiments of the invention are not limited to specific configurations shown in the drawings, and include modifications based on manufacturing processes. Further, each of components according to the invention may be enlarged or minimized in the drawings for the convenience of description.

Hereinafter, semiconductor devices according to embodiments of the present invention will be described with reference FIGS. 2 to 5. FIGS. 2 to 5 are cross-sectional views of semiconductor devices according to embodiments of the present invention.

Figure 2:
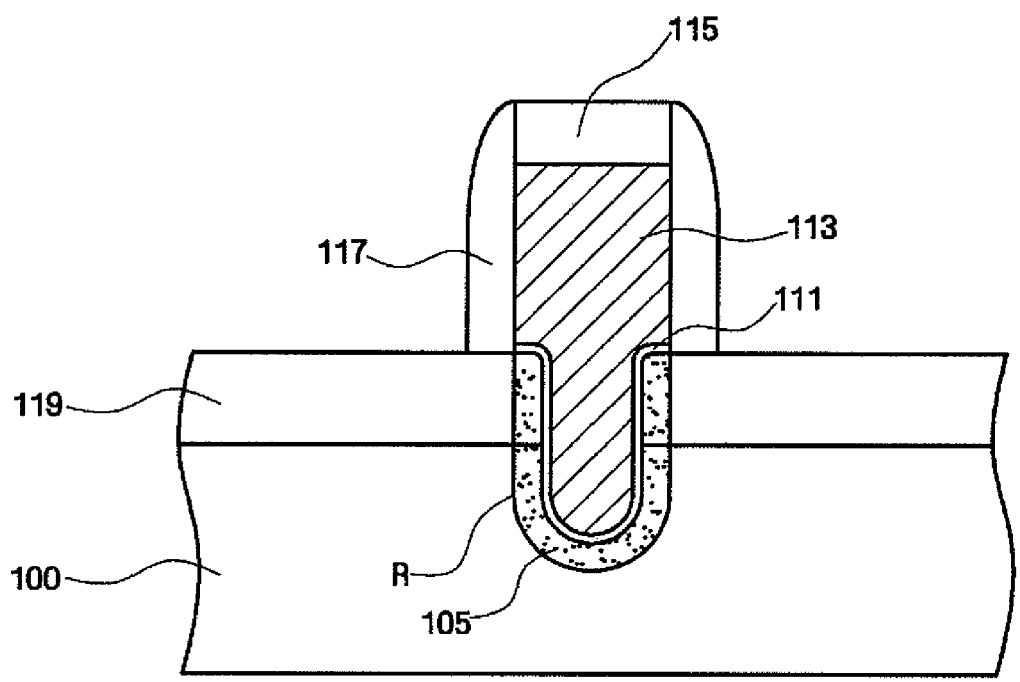
FIG. 2 is a cross-sectional view of a semiconductor device according to an exemplary embodiment of the present invention.

FIG. 2 is a cross-sectional view of a semiconductor device according to an embodiment of the present invention. Referring to FIG. 2, a semiconductor device according to an embodiment of the present invention includes a semiconductor substrate 100, a recess channel formed in a recess region R formed in the semiconductor substrate 100, a gate insulating film 111 and a gate electrode 113 that are formed on the recess channel, and source and drain regions 119.

A substrate or SOI (Silicon On Insulator) substrate made of one or more semiconductor materials selected from a group consisting of, for example, silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), and indium phosphide (InP) may be used as the semiconductor substrate 100. However, the material used to form the substrate 100 is not limited to these materials. The semiconductor substrate 100 is divided into active regions and element isolation regions by element isolation films that are formed by, for example, STI (Shallow Trench Isolation) or FOX (Field OXide).

A recess channel is provided between the source and drain regions 119 that is formed in the semiconductor substrate 100.

The recess channel is conformally formed in the recess region R that is formed between the source and drain regions 119, and is formed on an epitaxial semiconductor film 105 in which dopants are doped. Dopants for the formation of the recess channel are uniformly doped in the epitaxial semiconductor film 105.

The upper portion of the epitaxial semiconductor film 105 formed in the recess region R may be in the source and drain regions 119, and the recess channel is formed below the upper portion thereof so as to correspond to the epitaxial semiconductor film 105. In this case, as the recess channel is formed on the epitaxial semiconductor film 105 in which dopants are uniformly doped, it is possible to solve the difficulties in which the concentration of the dopants in the recess channel is not uniform depending on the position of the recess channel. The thickness of the epitaxial semiconductor film 105 may be in the range of about 100 to about 500 angstroms (Å), and may be appropriately adjusted depending on semiconductor devices.

As described above, the recess channel is formed in the epitaxial semiconductor film 105 that is formed on the semiconductor substrate 100 so as to correspond to the inner profile of the recess region R. Here, the recess channel is not necessarily formed in the epitaxial semiconductor film 105, and may be formed in the semiconductor substrate 100 in the vicinity of the recess region R.

The epitaxial semiconductor film 105 may be made of a material such as, for example, Si, SiGe, or SiC, and dopants are doped in the epitaxial semiconductor film 105. The dopants are P-type or N-type dopants that have a concentration suitable for the formation of the channel. In this case, the concentration of dopants may be appropriately adjusted depending on the characteristics of semiconductor devices.

For example, when the source and drain regions 119 are P-type regions, it is preferable that the epitaxial semiconductor film 105 of a PMOS transistor be made of Si or SiGe. When the source and drain regions 119 are N-type regions, it is preferable that the epitaxial semiconductor film 105 of a NMOS transistor be made of Si or SiC. With the exemplary embodiments of the present invention, a suitable threshold voltage and carrier mobility may be provided to each of the transistors.

A gate insulating film 111 is formed on the recess channel, and a gate electrode 113 is formed on the gate insulating film 111 so as to fill the recess region R. Reference numerals 115 and 117, indicate a hard mask film and an insulating spacer, respectively.

In FIG. 2, the width of the gate electrode 113 is equal to the width of the recess region R. However, the width of the gate electrode 113 is not limited thereto, and is increased or decreased depending on design rules of the semiconductor device, so that the sidewall profile of the gate electrode 113 is not aligned with the sidewall profile of the recess region R.

As described above, as the semiconductor device according to the embodiment of the present invention includes a recess channel formed on the semiconductor substrate 100 so as to correspond to the profile of the recess region R, the effective length of the channel is increased. As a result, it is possible to suppress a short channel effect. In addition, the recess channel is formed on the inner surface of the recess region R, and is formed in the epitaxial semiconductor film 105 in which the dopants are uniformly doped. For this reason, it is possible to maintain uniform concentration of dopants in the recess channel. As a result, it is possible to further improve the characteristics and the reliability of the semiconductor device.

Figure 3:
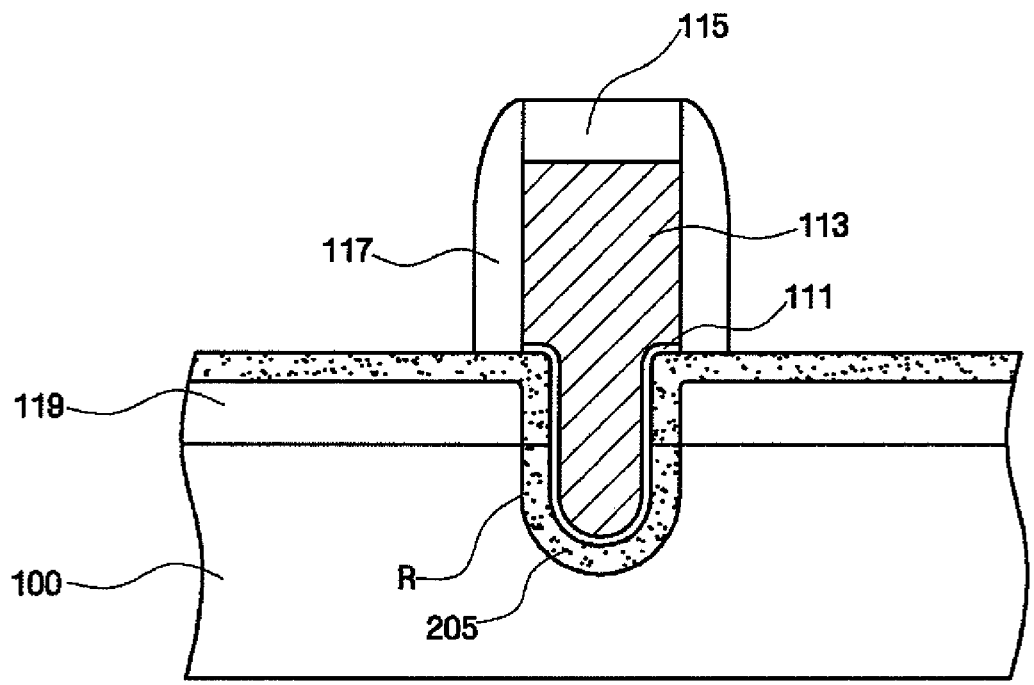
FIG. 3 is a cross-sectional view of a semiconductor device according to an exemplary embodiment of the present invention.

FIG. 3 is a cross-sectional view of a semiconductor device according to another embodiment of the present invention. Referring to FIG. 3, an epitaxial semiconductor film 205 is formed on the inner surface of a recess region R so as to extend onto a semiconductor substrate 100.

In this case, a portion of the epitaxial semiconductor film 205, which is positioned at the upper portion of the recess region R, and a portion of the epitaxial semiconductor film 205, which extends onto the semiconductor substrate 100, may be included in source and drain regions 219.

Figure 4:
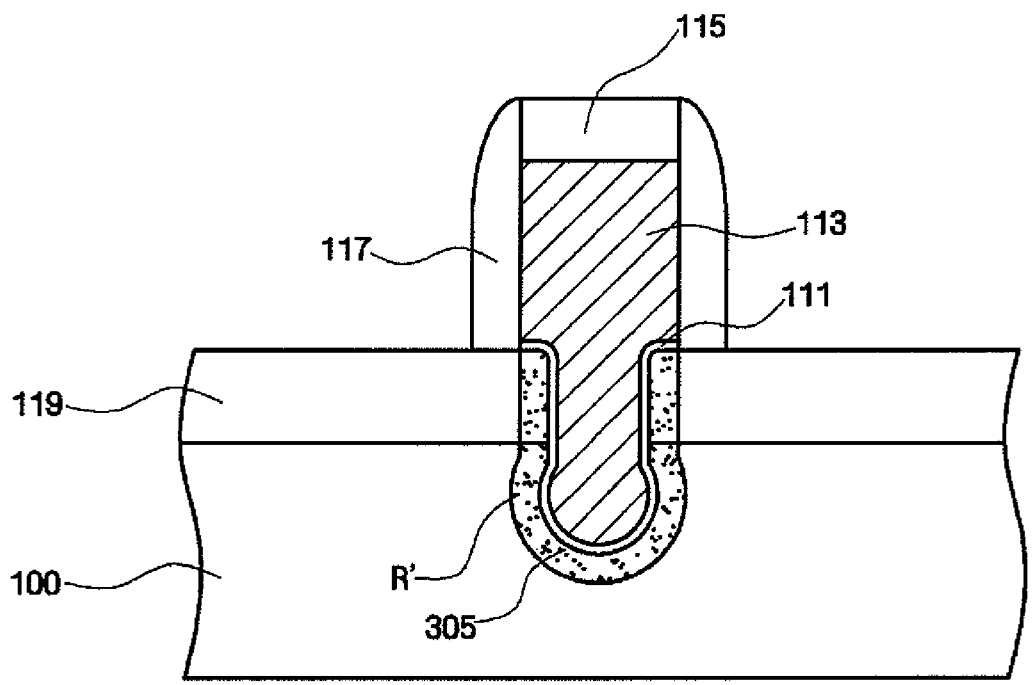
FIG. 4 is a cross-sectional view of a semiconductor device according to an exemplary embodiment of the present invention.

FIG. 4 is a cross-sectional view of a semiconductor device according to another embodiment of the present invention. Referring to FIG. 4, a recess region R', of which lower portion has a width larger than that of the upper portion thereof, is formed on a semiconductor substrate 100. An epitaxial semiconductor film 305 is conformally formed on the inner surface of the recess region R' having the larger width as described above. Accordingly, the lower portion of the recess channel is formed in a spherical shape so as to have a width larger than the upper portion thereof.

According to the above-mentioned semiconductor device, it is possible to increase the length of the channel. Further, when the lower portion of a trench is formed in a spherical shape, the lower portion of the trench has a radius of curvature larger than that of a common trench. Accordingly, it is possible to prevent the concentration of an electric field. As a result, it is possible to improve the refresh time characteristics. That is, as the length of the channel is increased and the refresh time characteristics are improved, it is possible to further improve the characteristic of the semiconductor device.

Figure 5:
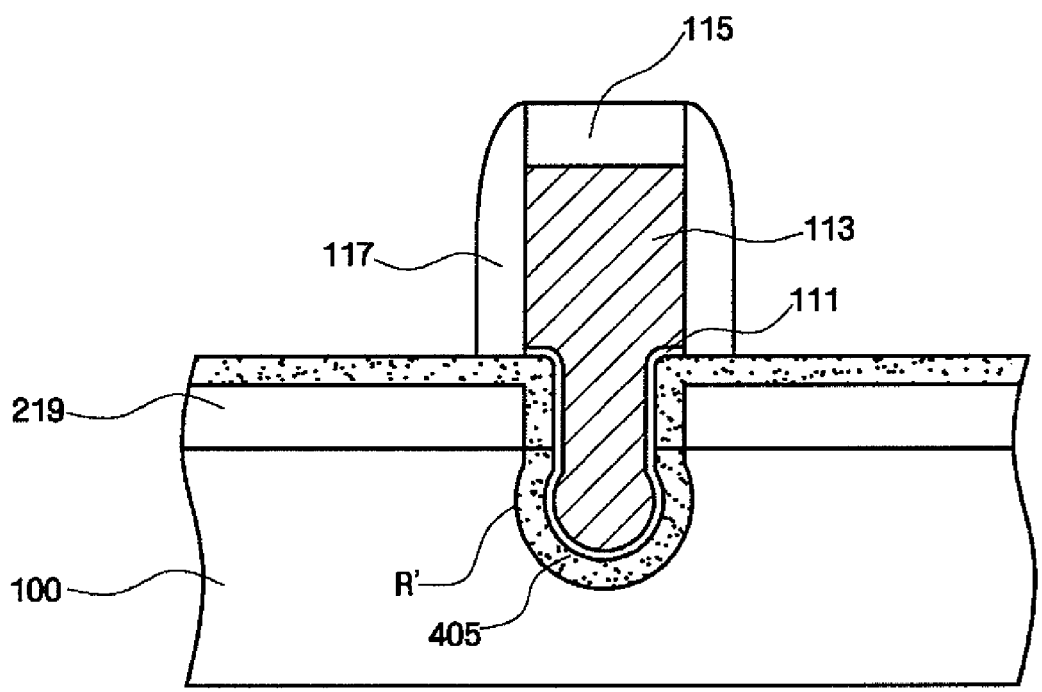
FIG. 5 is a cross-sectional view of a semiconductor device according to an exemplary embodiment of the present invention.

FIG. 5 is a cross-sectional view of a semiconductor device according to another embodiment of the present invention. Referring to FIG. 5, an epitaxial semiconductor film 405 is formed on the inner surface of a recess region R' having a larger width, and extends onto a semiconductor substrate 100.

In this case, a portion of the epitaxial semiconductor film 405, which is positioned at the upper portion of the recess region R', and a portion of the epitaxial semiconductor film 405, which extends onto the semiconductor substrate 100, are included in source and drain regions 219.

As described above, as each of the semiconductor devices according to the embodiments of the present invention includes the recess channel in which dopants are uniformly doped, it is possible to improve the characteristics and the reliability of each semiconductor device. In addition, each of the semiconductor devices according to the embodiments of the present invention may be applied to a low voltage transistor in the vicinity of a cell region and a high voltage transistor device in the vicinity of a peripheral circuit region.

Hereinafter, a method of manufacturing the semiconductor device shown in FIG. 2 will be described with reference to FIGS. 6 to 10. FIGS. 6 to 10 FIGS. 6 to 10 are cross-sectional views sequentially illustrating a method of manufacturing the semiconductor device. In the following description of the method of manufacturing the semiconductor device, processes related to processes widely known to those skilled in the art of the present invention will be schematically described to avoid ambiguous definition of the present invention. Further, substantially the same structure, material, and the like as those described in the above-mentioned semiconductor device will be omitted or described in brief to avoid repetition of the description.

Figure 6:
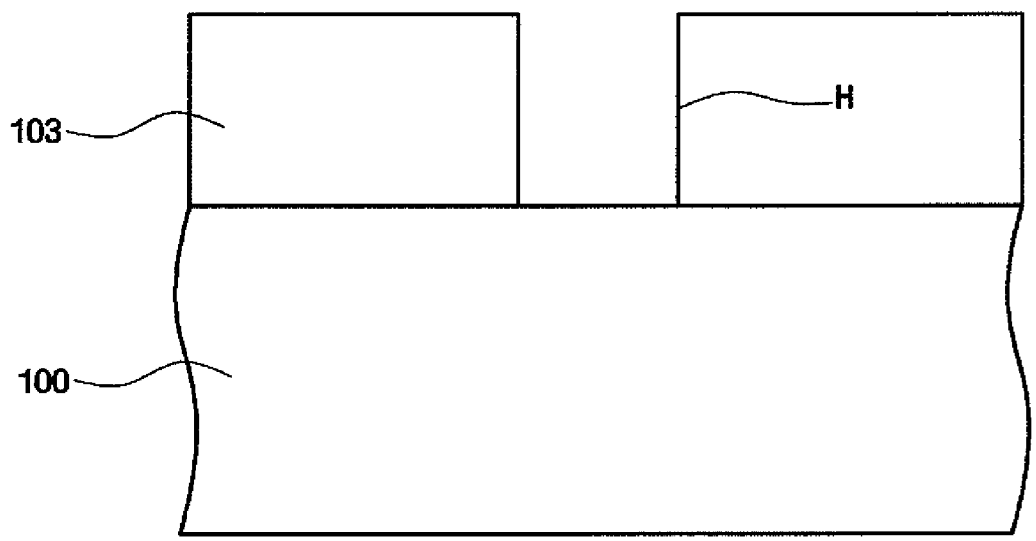
FIGS. 6 to 10 are cross-sectional views illustrating a method of manufacturing the semiconductor device shown in FIG. 2.

First, as shown in FIG. 6, there is provided the semiconductor substrate 100 on which active regions are defined by element isolation films. Each of the element isolation films may be formed using, for example, a LOCOS (Local Oxidation of Silicon) process or a STI (Shallow Trench Isolation) process.

Subsequently, the molded insulating film 103 having an opening H is formed on the semiconductor substrate 100. In this case, the upper surface of the semiconductor substrate 100 is exposed to the outside through the opening H. The exposed semiconductor substrate 100 is a portion on which the recess region used to form the recess channel is formed. The molded insulating film 103 is a hard mask pattern, and may be formed of, for example, an insulating film such as a silicon oxide film or silicon nitride film.

Figure 7:
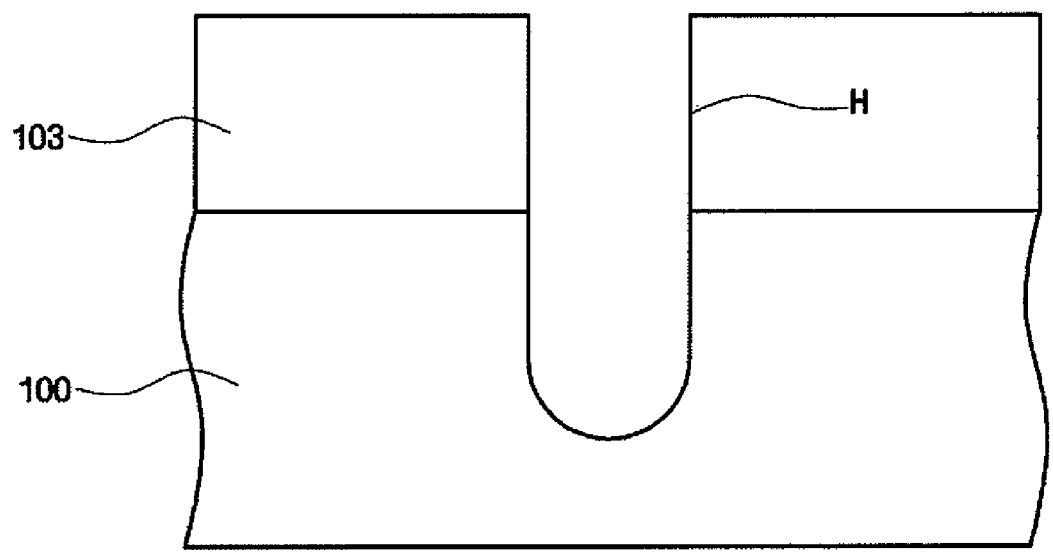

Next, as shown in FIG. 7, the molded insulating film 103 is used as an etch mask so as to form the recess region R in the semiconductor substrate 100.

In this case, the portion of the semiconductor substrate 100, which is exposed to the outside through the opening H, is anisotropically etched, thereby forming the recess region R. As shown in FIG. 7, the recess region R may have a cross section in which a central portion of the recess region R is deeper than other portions of the recess region R. However, the cross section of the recess region R is not limited thereto. The anisotropic etching may be performed by dry etching such as, for example, reactive ion etching (RIE), but is not limited thereto.

Figure 8:
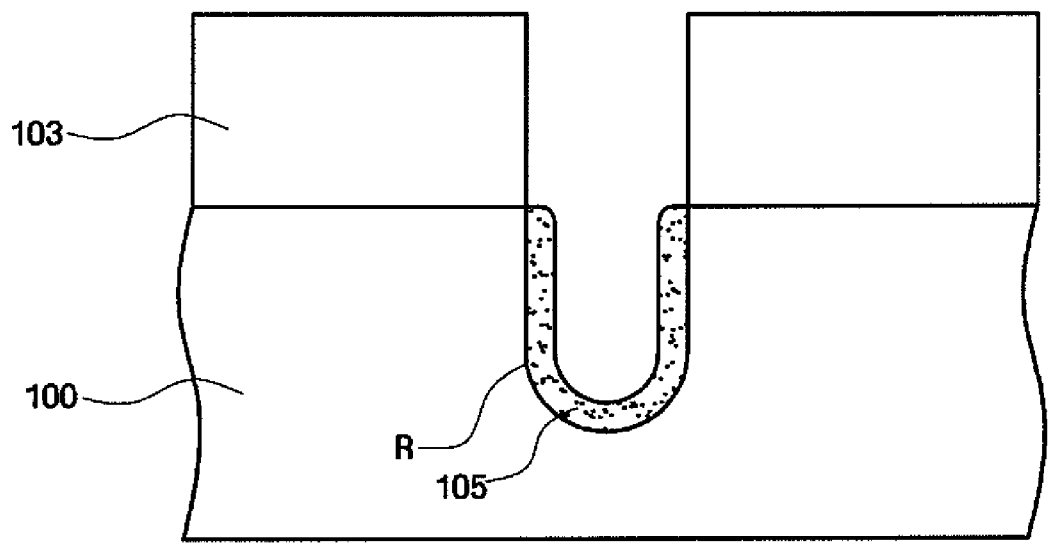

Subsequently, the epitaxial semiconductor film 105 in which dopants are doped is conformally formed on the inner surface of the recess region R, as shown in FIG. 8. In this case, the concentration of dopants may be maintained at a concentration suitable for forming the channel.

The epitaxial semiconductor film 105 may be formed using, for example, a selective epitaxy growth (SEG) process. According to the selective epitaxy growth process, the epitaxial semiconductor film 105 is formed only on the portion, which is exposed to the outside, of the semiconductor substrate 100, and is not formed on the molded insulating film 103.

The epitaxial semiconductor film 105 may be made of a material such as, for example, Si, SiGe, or SiC. Considering the characteristic of the semiconductor device, for example, it is preferable that the epitaxial semiconductor film 105 be made of Si or SiGe when dopants to be implanted to the source and drain regions are P-type dopants, and it is preferable that the epitaxial semiconductor film 105 be made of Si or SiC when dopants to be implanted to the source and drain regions are N-type dopants.

The selective epitaxy growth process may be performed by, for example, an LPCVD (Low Pressure Chemical Vapor Deposition) method or an UHV-CVD (Ultra High Vacuum Chemical Vapor Deposition) method, but is not limited thereto. Further, when the epitaxial semiconductor film 105 is formed, the dopants for the formation of the channel may be doped by an in-situ process.

For example, the selective epitaxy process for forming the epitaxial semiconductor film 105 may be performed at a temperature of about 500 to about 900° C. and at a pressure of about 1 to about 500 Torr, and may be appropriately adjusted without departing from the scope and spirit of the present invention. Further, for example, silane ($SiH_4$), dichlorosilane ($SiH_2Cl_2$), trichlorosilane ($SiHCl_3$), silicon tetrachloride ($SiCl_4$), $SiH_xCl_y$(x+y=4), tetrabuthoxysilane ($Si(OC_4H_9)_4$), tetramethoxysilane ($Si(OCH_3)_4$), tetraethoxysilane ($Si(OC_2H_5)_4$) or the like may be used as the silicon source gas, and germane ($GeH_4$), germanium tetrachloride ($GeCl_4$), $GeH_xCl_y$(x+y=4) or the like may be used as germanium (Ge) source gas. Furthermore, for example, CxHy, methyl silane ($CH_3SiH_3$) or the like may be used as carbon source gas. However, the silicon source gas, the Ge source gas and the carbon source gas are not limited thereto. Furthermore, a gas such as, for example, hydrogen chloride (HCl) or chlorine ($Cl_2$) may be added to the source gases to improve the selective characteristic. When HCl or the like is added to the source gases, it is possible to achieve the selective epitaxy growth. In the selective epitaxy growth, an epitaxial layer is not formed on the element isolation film or the molded insulating film 103 that is formed of an oxide film or a nitride film, and is formed on the semiconductor substrate, that is, in the region where Si is exposed to the outside. In this case, a dopant gas may be added to the source gases so as to dope dopants to the epitaxial semiconductor film 105. As described above, when the epitaxial semiconductor film is formed, the dopants may be doped by, for example, an in-situ process. However, the exemplary embodiments of the present invention are not limited thereto. That is, after the epitaxial semiconductor film is formed, the dopants may also be doped by an ex-situ process.

The epitaxial semiconductor film 105 may be conformally formed so as to correspond to the inner profile of the recess region R. The thickness of the epitaxial semiconductor film 105 may be in the range of about 100 to about 500 Å, but is not limited thereto.

As described above, according to the embodiments of the present invention, the recess region for the formation of the recess channel is formed and the epitaxial semiconductor film 105 is then conformally formed in the recess channel. Accordingly, the width of the portion of the recess in which the lower portion of the gate electrode is substantially formed may be smaller than the width of the recess region R by the thickness of the epitaxial semiconductor film 105. For this reason, it is possible to form a recess region wider than the recess region required to substantially form the gate electrode. As a result, even though the designs are reduced, it is possible to obtain a margin in photo processes, which makes the processes beneficial.

Figure 9:
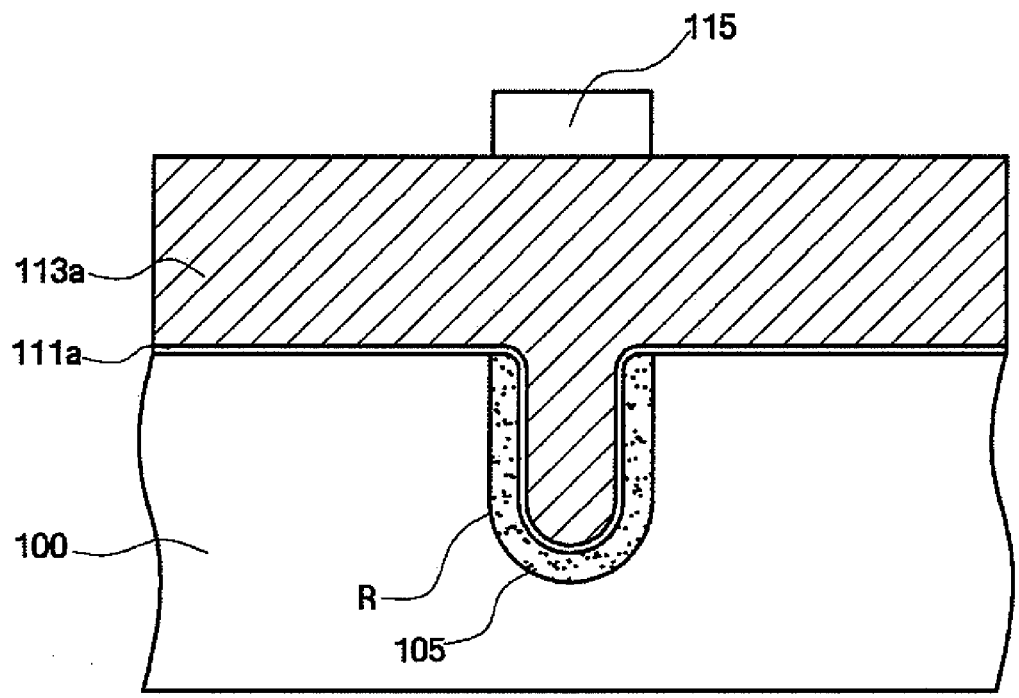

Subsequently, as shown in FIG. 9, the molded insulating film is removed, and a gate insulating film 111a is then formed in the recess region R.

A silicon oxide film formed by thermally oxidizing the semiconductor substrate 100, a film made of, for example, silicon oxynitride (SiON), germanium oxynitride (GexOyNz), germanium silicon oxide (GexSiyOz), a high dielectric material, and the combination thereof, or a laminated film obtained by laminating the silicon oxide film and the above-mentioned film in this order, may be used as the gate insulating film 111a. The high dielectric material may include, for example, hafnia ($HfO_2$), zirconia ($ZrO_2$), aluminum oxide ($Al_2O_3$), tantalum pentoxide ($Ta_2O_5$), hafnium silicate, zirconium silicate, and the combination thereof.

After that, a gate electrode conductive film 113a is formed on the gate insulating film 111a, and a hard mask 115 used to form a gate is formed on the electrode conductive film 113a.

Figure 10:
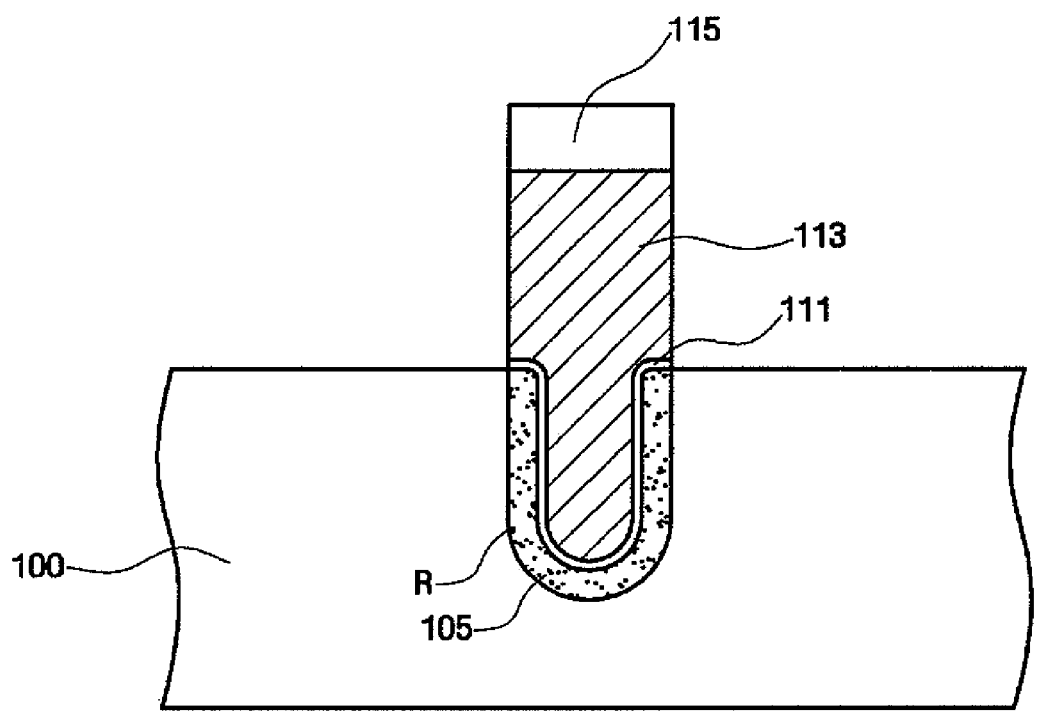

Subsequently, as shown in FIG. 10, the hard mask 115 is used as an etch mask, and the gate electrode 113 is patterned. As a result, the source and drain regions 119 are formed as shown in FIG. 1 so as to form the semiconductor device shown in FIG. 2.

The source and drain regions 119 may have a lightly doped drain (LDD) or double diffused drain (DDD) structure, depending on, for example, the characteristic of the semiconductor device. Further, insulating spacers 117 may be formed on the sidewalls of the gate electrode 113 in a process for forming the source and drain regions 119.

Hereinafter, a method of manufacturing the semiconductor device shown in FIG. 3 will be described with reference to FIGS. 11 to 13. Further, substantially the same structure, material, manufacturing processes and the like as those described in the above-mentioned semiconductor device and method of manufacturing the semiconductor device will be omitted or described briefly to avoid repetition of the description, and differences between the above-mentioned embodiments and another embodiment will be mainly described below. In addition, as the processes for manufacturing the semiconductor device described with reference to FIGS. 6 and 7 can be applied to this embodiment, only processes succeeding to the processes described with reference to FIGS. 6 and 7 will be described below.

Figure 11:
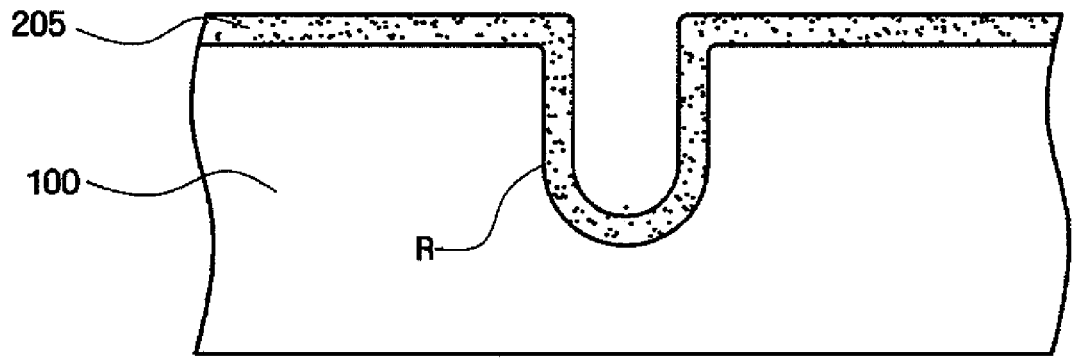
FIGS. 11 to 13 are cross-sectional views illustrating a method of manufacturing the semiconductor device shown in FIG. 3.

Referring to FIG. 11, first, before the epitaxial semiconductor film 205 is formed, the molded insulating film (corresponding to reference numeral 103 in FIG. 7) for the formation of the recess region R is removed. After that, the epitaxial semiconductor film 205 is conformally formed in the recess region R and on the semiconductor substrate 100.

Figure 12:
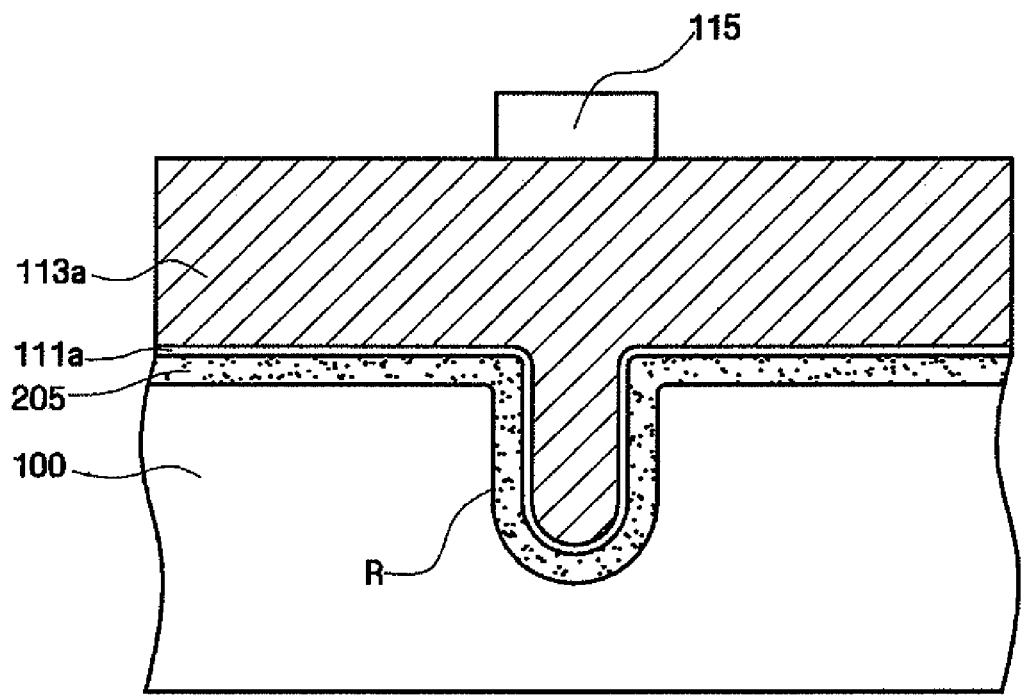
Figure 13:
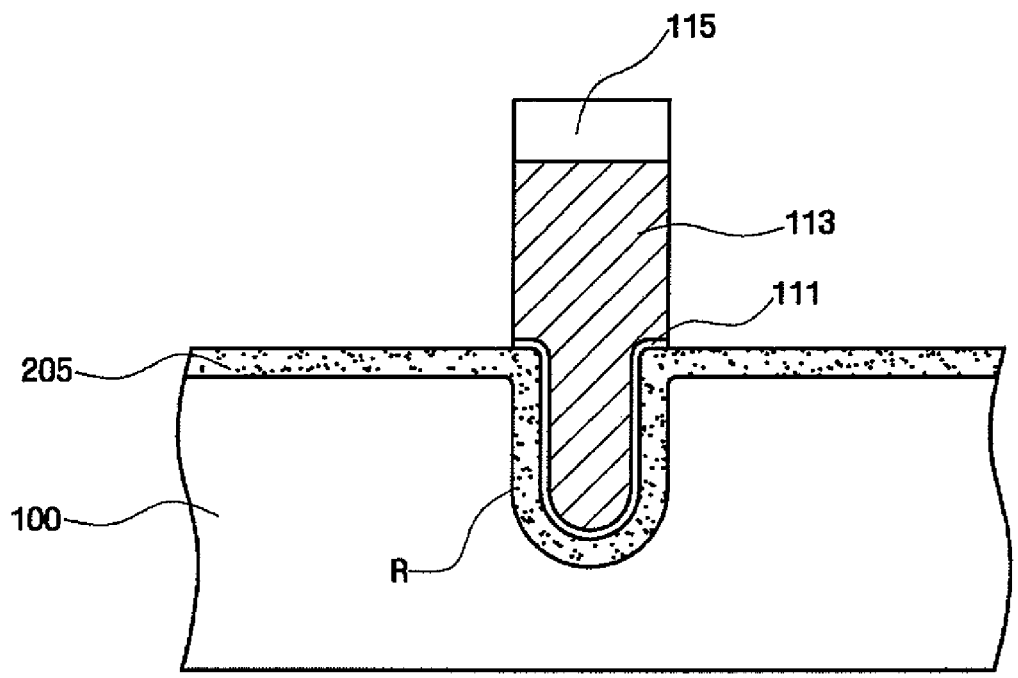

Subsequently, the gate insulating film 111a is formed as shown in FIG. 12, and the gate electrode conductive film 113a and the hard mask 115 are formed on the gate insulating film 111a. After that, as shown in FIG. 13, the hard mask 115 is used as an etch mask, and the gate electrode 113 is patterned. As a result, the source and drain regions 219 are formed so as to form the semiconductor device shown in FIG. 3. In this case, the source and drain regions 219 include a portion of the epitaxial semiconductor film 205 that is formed on the semiconductor substrate 100.

Hereinafter, a method of manufacturing the semiconductor device shown in FIG. 4 will be described with reference to FIGS. 14 to 18. Further, substantially the same structure, material, manufacturing processes and the like as those described in the above-mentioned semiconductor device and method of manufacturing the semiconductor device will be omitted or described briefly to avoid repetition of the description, and differences between the above-mentioned embodiments and another embodiment will be mainly described below. In addition, as the processes for manufacturing the semiconductor device described with reference to FIG. 6 can be applied to this embodiment, only processes succeeding to the processes described with reference to FIG. 6 will be described below.

Figure 14:
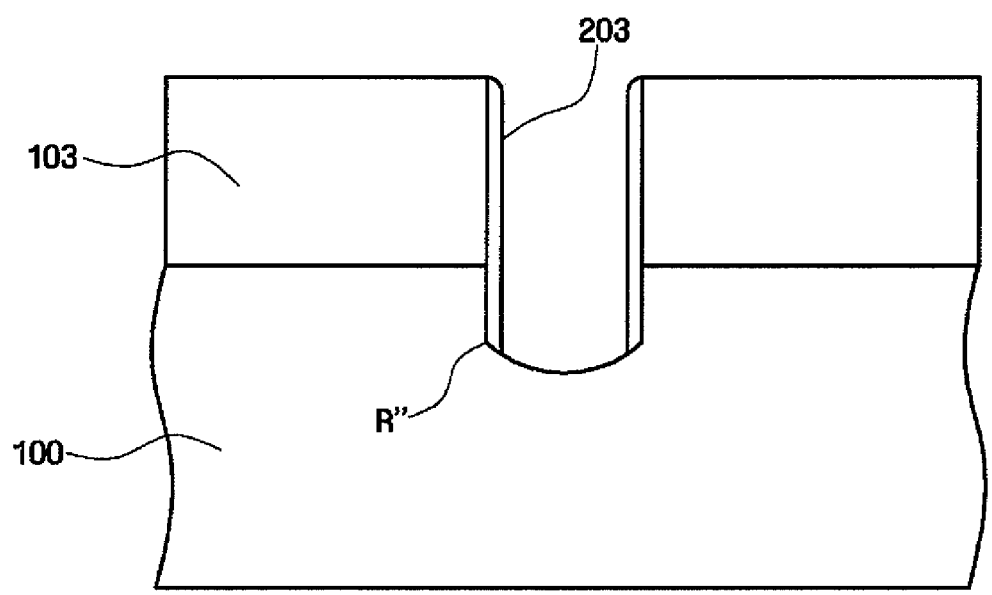
FIGS. 14 to 18 are cross-sectional views illustrating a method of manufacturing the semiconductor device shown in FIG. 4.

Referring to FIG. 14, the molded insulating film 103 is used as an etch mask, and the semiconductor substrate 100 is anisotropically etched so as to form a preliminary recess region R".

After that, a sidewall passivation film 203 for exposing the semiconductor substrate 100, which is provided at the bottom of the preliminary recess region R", to the outside is formed. The sidewall passivation film 203 may be formed of a MTO (Medium Temperature Oxide) film that is formed by, for example, a thermal oxidization process or CVD method. When a passivation film is conformally formed in the preliminary recess region R" and then anisotropically etched, the semiconductor substrate 100 can be exposed to the outside through the preliminary recess region R" at the bottom of the preliminary recess region R". In this case, although the sidewall passivation film 203 remains on the sidewalls of the molded insulating film 103 in FIG. 14, the sidewall passivation film may not remain on the sidewalls of the molded insulating film 103. The sidewall passivation film 203 can prevent the sidewalls of the preliminary recess region R" from being etched in processes succeeding to the etching process.

Figure 15:
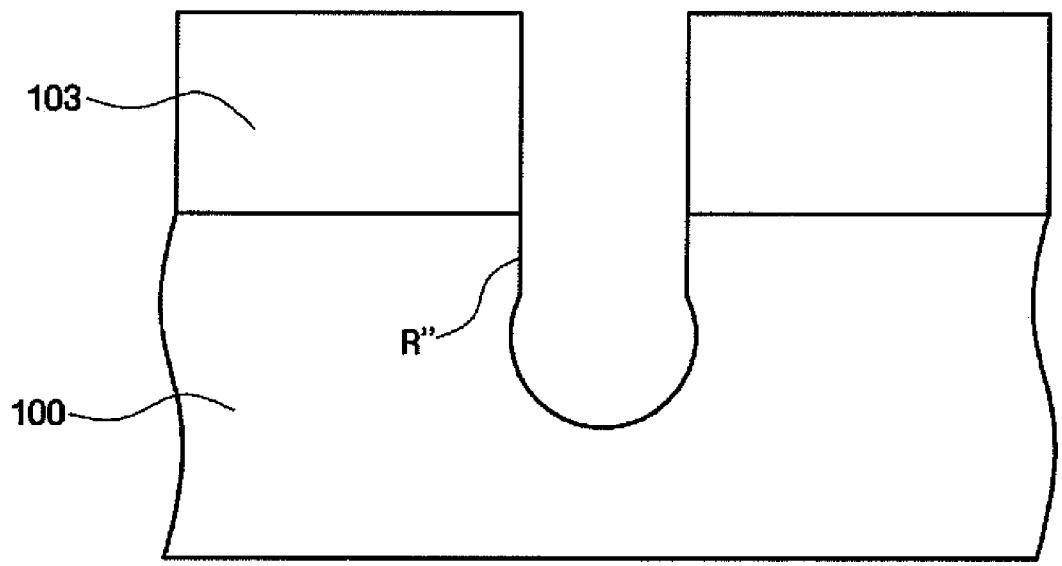

Next, as shown in FIG. 15, the lower portion of the preliminary recess region R" is expanded, so that a recess region R', of which upper portion has a width larger than that of the lower portion thereof is completely formed. The lower portion of the recess region R' may be formed in, for example, a spherical shape. In this case, the spherical shape is not limited to a spherical shape having a constant radius.

Meanwhile, the lower portion of the preliminary recess region R" may be expanded by isotropic etching. In this case, the isotropic etching may be performed by wet etching using, for example, a solution in which ammonium hydroxide ($NH_4OH$), peroxide ($H_2O_2$), and water ($H_2O$) are mixed, and by CDE (Chemical dry etching) using radical of tetrafluoromethane ($CF_4$) and oxygen ($O_2$) gases. However, the isotropic etching is not limited thereto. As the sidewall passivation film 203 is formed on the sidewalls of the recess region R', the isotropic etching is performed only in the semiconductor substrate 100. After that, the sidewall passivation film 203 is removed.

Figure 16:
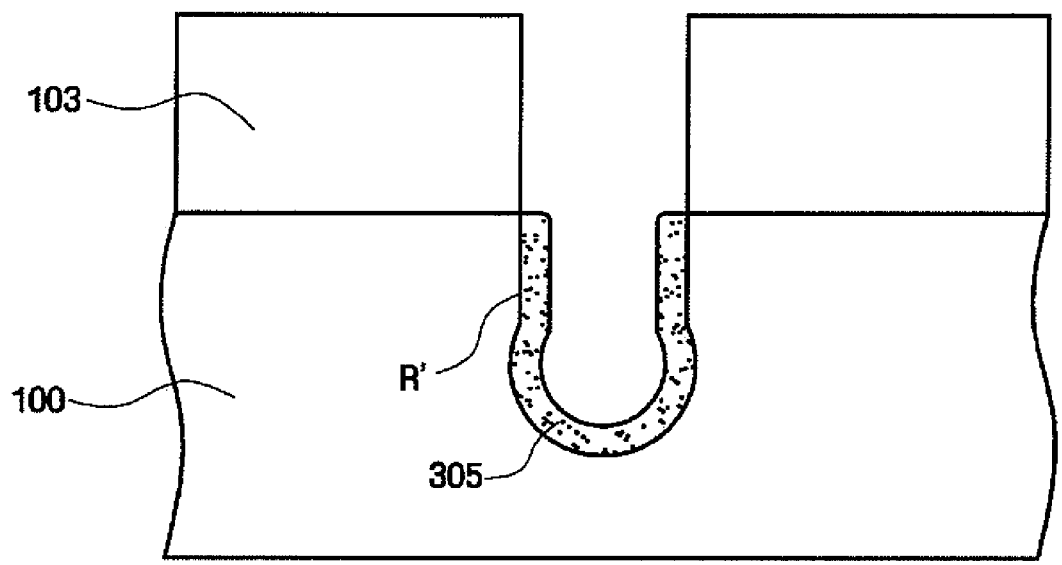

Subsequently, as shown in FIG. 16, the conformal epitaxial semiconductor film 305 is selectively formed in the recess region R'.

The sidewall passivation film 203 may be removed using, for example, diluted hydrofluoric acid or BOE (buffered oxide etchant) solution. As the sidewall passivation film 203 is removed, it is possible to expose the sidewall of the recess region R' to the outside.

Next, the epitaxial semiconductor film 305 can be conformally formed on the exposed recess region R'.

Figure 17:
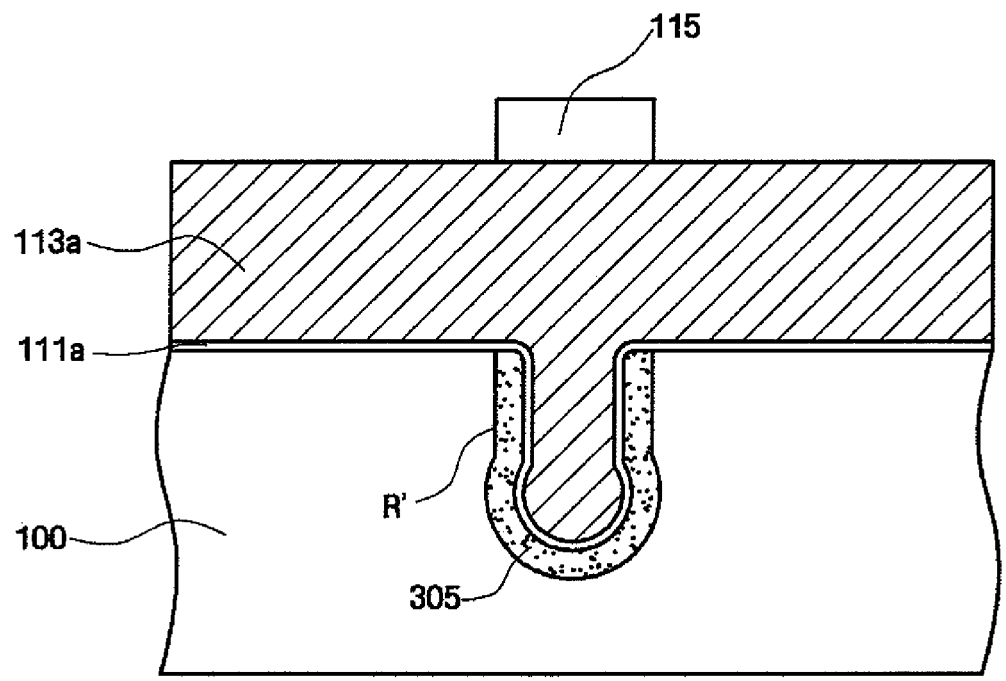
Figure 18:
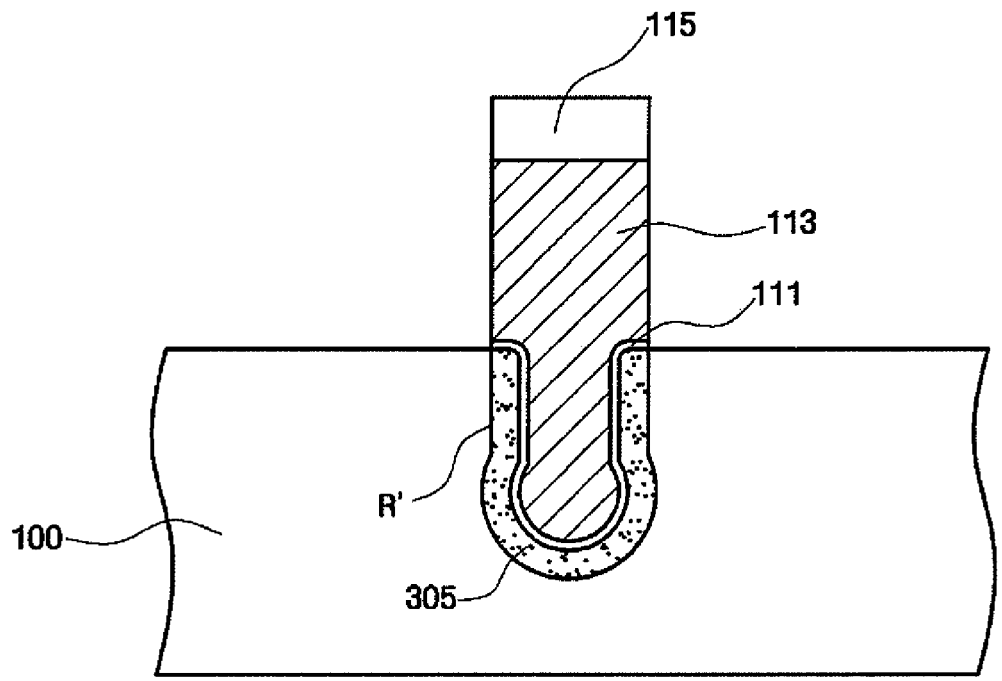

Subsequently, as shown in FIGS. 17 and 18, the molded insulating film is removed, and the gate insulating film 111a and the gate electrode conductive film 113a are then formed on the semiconductor substrate 100. After that, the hard mask 115 is used as an etch mask, and patterning is performed. As a result, the source and drain regions 219 are formed so as to form the semiconductor device shown in FIG. 4.

As described above, when the lower portion of the recess channel is formed in a spherical shape, it is possible to increase the effective length of the channel. Further, when the bottom of the trench is formed in a spherical shape, the bottom of the trench has a radius of curvature larger than that of a common trench. Accordingly, it is possible to prevent the concentration of an electric field. As a result, it is possible to reduce leakage current, and to ensure sufficient refresh time. That is, as the length of the channel is increased and the refresh time characteristic is improved, the transistor can more stably operate.

Hereinafter, a method of manufacturing the semiconductor device shown in FIG. 5 will be described with reference to FIGS. 19 to 21. Further, substantially the same structure, material, manufacturing processes and the like as those described in the above-mentioned semiconductor device and method of manufacturing the semiconductor device will be omitted or described briefly to avoid repetition of the description, and differences between the above-mentioned embodiments and another embodiment will be mainly described below. In addition, as the processes for manufacturing the semiconductor device described with reference to FIGS. 14 and 15 can be applied to this embodiment, only processes succeeding to the processes described with reference to FIGS. 14 and 15 will be described below.

Figure 19:
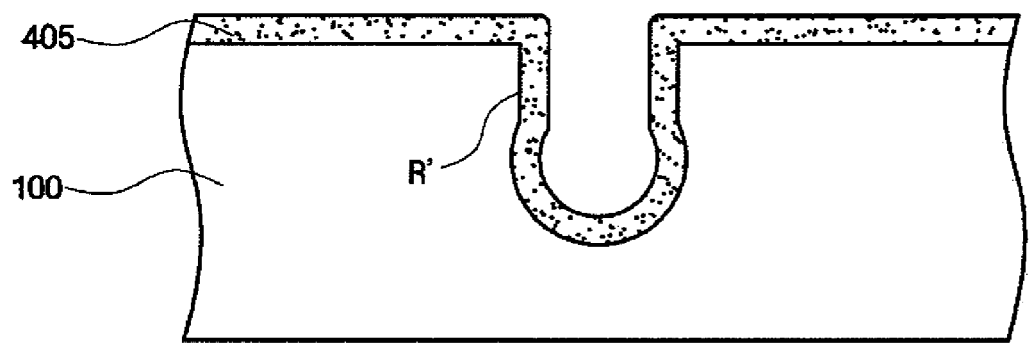
FIGS. 19 to 21 are cross-sectional views illustrating a method of manufacturing the semiconductor device shown in FIG. 5.

Referring to FIG. 19, before the epitaxial semiconductor film 405 is formed, the sidewall passivation film (corresponding to reference numeral 203 in FIG. 15) and the molded insulating film (corresponding to reference numeral 103 in FIG. 15) are removed. Accordingly, the epitaxial semiconductor film 205 can be conformally formed in the recess region R' and on the semiconductor substrate 100.

Figure 20:
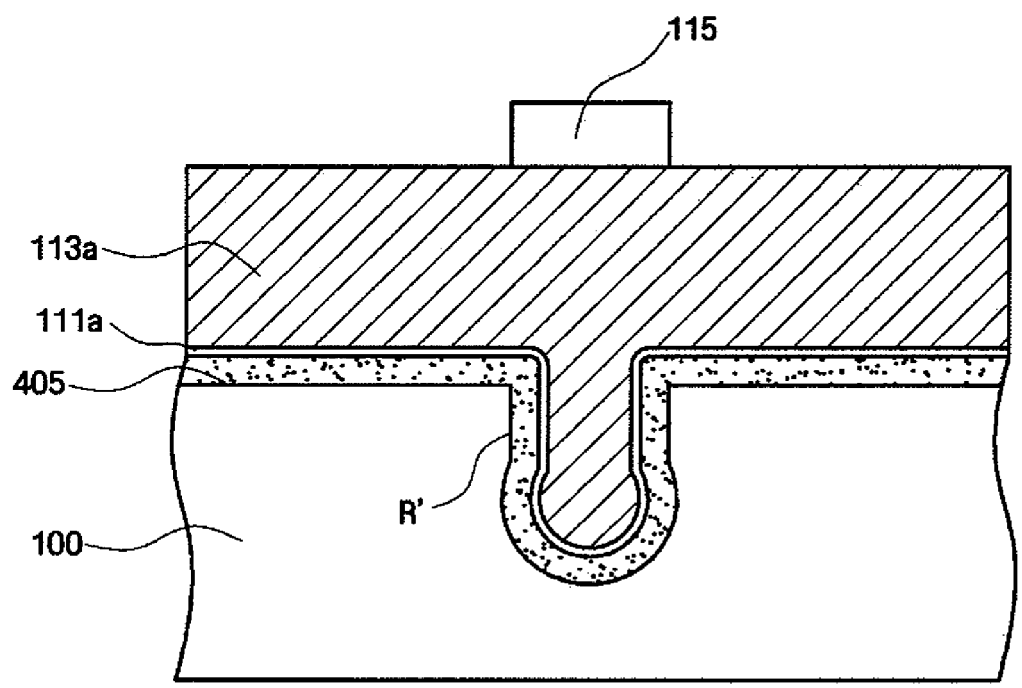
Figure 21:
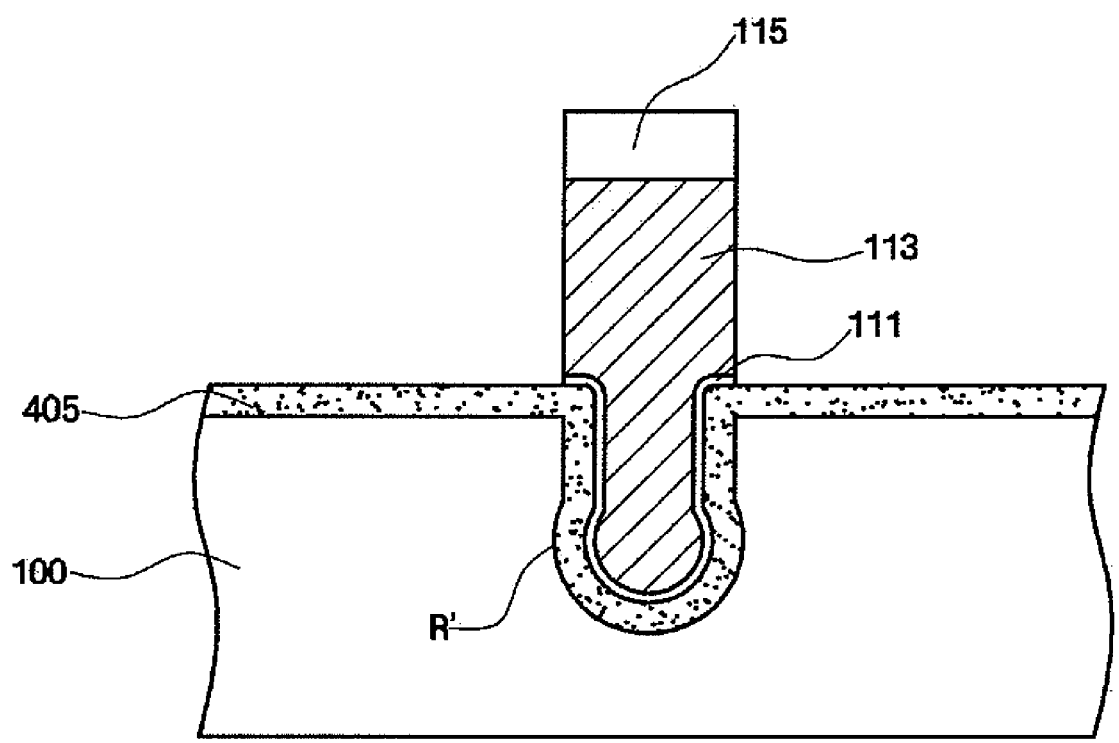

Subsequently, as shown in FIGS. 20 and 21, the gate insulating film 111a and the gate electrode conductive film 113a are formed on the semiconductor substrate 100, and the hard mask 115 is used as an etch mask so as to perform patterning. As a result, the gate electrode 113 and the source and drain regions 219 are formed so as to form the semiconductor device shown in FIG. 5.

According to the above-mentioned semiconductor device and the method of manufacturing the semiconductor device of embodiments of the present invention, it is possible to obtain at least the following benefits set forth below.

First, it is possible to ensure the effective length of the channel by the formation of the recess channel. As a result, it is possible to suppress a short channel effect.

Second, as it is possible to maintain uniform concentration of dopants in the recess channel, it is possible to improve the characteristic of the semiconductor device.

Third, as the upper portion of the recess region has a width larger than that of the lower portion thereof, it is possible to increase the length of the channel.

Fourth, as the bottom of the trench is formed in a spherical shape, the bottom of the trench has a radius of curvature larger than that of a common trench. Accordingly, it is possible to prevent the concentration of an electric field. As a result, it is possible to reduce leakage current, and to improve refresh time characteristics.

Fifth, as the length of the channel is increased and the refresh time characteristics are improved, the transistor can be more stably operated.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
    a semiconductor substrate;
    source and drain regions formed on the semiconductor substrate;
    an epitaxial semiconductor film formed on the inner surface of a recess region formed on the semiconductor substrate between the source and drain regions;
    a gate insulating film formed on the epitaxial semiconductor film; and
    a gate electrode filling the recess region, the gate electrode being formed on the gate insulating films,
    wherein dopants are doped in the epitaxial semiconductor film uniformly.

2. The semiconductor device of claim 1, wherein the epitaxial semiconductor film is made of silicon (Si), silicon germanium (SiGe), or silicon carbide (SiC).

3. The semiconductor device of claim 2, wherein the source and drain regions are N-type regions, and the epitaxial semiconductor film is made of Si or SiC.

4. The semiconductor device of claim 2, wherein the source and drain regions are P-type regions, and the epitaxial semiconductor film is made of Si or SiGe.

5. The semiconductor device of claim 1, wherein the lower portion of the recess region is formed in a spherical shape so as to have a width larger than the upper portion thereof.

* * * * *